(12) United States Patent
Liu et al.

(10) Patent No.: US 7,511,652 B1
(45) Date of Patent: Mar. 31, 2009

(54) COMPARISON DEVICE AND ANALOG-TO-DIGITAL CONVERTER

(75) Inventors: Wen-bo Liu, Urbana, IL (US); Szu-Kang Hsien, Yangmei Township, Taoyuan County (TW); Yun Chiu, Urbana, IL (US)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/967,258

(22) Filed: Dec. 31, 2007

(51) Int. Cl.
*H03M 1/12* (2006.01)

(52) U.S. Cl. ...................... 341/155; 341/120
(58) Field of Classification Search ................. 341/155, 341/161, 118, 120, 150, 143
See application file for complete search history.

(56) References Cited

U.S. PATENT DOCUMENTS

| | | | |
|---|---|---|---|
| 5,696,508 A | 12/1997 | Gross, Jr. et al. | |
| 6,084,538 A * | 7/2000 | Kostelnik et al. | 341/120 |
| 6,420,983 B1 | 7/2002 | Feygin et al. | |
| 6,459,394 B1 * | 10/2002 | Nadi et al. | 341/120 |
| 6,489,904 B1 * | 12/2002 | Hisano | 341/120 |
| 6,822,601 B1 * | 11/2004 | Liu et al. | 341/161 |
| 7,064,693 B1 | 6/2006 | Huang et al. | |
| 7,075,465 B2 | 7/2006 | Jonsson et al. | |

* cited by examiner

*Primary Examiner*—Brian Young
(74) *Attorney, Agent, or Firm*—Jianq Chyun IP Office

(57) ABSTRACT

The comparison device includes a first through second comparators, a chop switching unit, a delta-sigma modulation unit, and a first through second compensation units. The chop switching unit transmits a first and a second signals to two input terminals of the first comparator during a first period, and inverses the first and second signals during a second period. The delta-sigma modulation unit compares the comparison results of two parallel comparators and generates the digital control codes for the comparators with the awareness of the chop switching unit. The first and the second compensation units adjust the threshold voltages of the comparators according to the digital control codes and a step size for calibrating the offset voltages of two comparators. The calibration scheme requiring no assumption on the input signal statistics is background thus the comparison device will not interrupt normal operation and is immune to PVT variations.

10 Claims, 6 Drawing Sheets

COMPARISON DEVICE AND ANALOG-TO-DIGITAL CONVERTER

BACKGROUND OF THE INVENTION

1. Field of the Invention

The present invention relates to a comparison device and an analog-to-digital converter using the same adaptive background calibration scheme, and more particularly, to a device with adaptive background calibration scheme that can eliminate an offset voltage of the comparators.

2. Description of Related Art

With the continuous increase of communication network bandwidth, a conversion rate of a front-end analog-to-digital converter (ADC) must be increased for the requirements of an overall system. A flash ADC is the most popular architecture to implement high sampling rate ADC. FIG. 1 is a circuit diagram of the flash ADC. Referring to FIG. 1, the flash ADC 100 consists of $2^N-1$ comparators for comparing the sampled signal Vi with different reference voltages Vr, and also consists of encoder 110 for performing the bubble prevention and converting the thermal codes to the binary codes. The intrinsic limitations of the flash ADC 100 are the process variation of a reference ladder resistance, the mismatch among the $2^N-1$ signal paths, and the threshold mismatch among the comparators.

The process variation of a reference ladder resistance is not a big problem at the moderate accuracy level, e.g. 6-8 bit. The mismatch problem of the signal propagation delay and the synchronization problem of the strobe clock signal can be solved by putting a front-end dedicated track-and-hold amplifier before the comparator array. A comparator includes a preamplifier and a latch. The straightforward way to overcome the threshold mismatch problem among the comparators is to enlarge the size of the preamplifiers for getting enough accumulative gain before the latches and reducing the influence of the latches' offset voltage. However, the ADC power efficiency is lowered because of the strong tradeoff among accuracy, speed, and power consumption.

FIG. 2 is a circuit diagram of background comparator offset calibration technique for flash ADC converters disclosed in U.S. Pat. No. 7,064,693. Referring to FIG. 2, the random chopping comparator includes a comparator 210 together with two choppers CHP1 and CHP2, wherein the offset voltage Vos of the comparator is unknown. The choppers CHP1 and CHP2 has two states: in forward states, the input signals Vi and Vr are connected to the input terminals of the comparator 210, and the digital signal Di outputted from the comparator serves as an output signal De; in the reversed state, the input signal Vi and Vr are reversed and connected to the input terminals of the comparator 210, and the digital signal Di outputted from the comparator is inversed and serves as an output signal Dc. The choppers CHP1 and CHP2 are controlled by the random sequence q[k], which the probability of generating a forward signal or a reversed signal is 50%.

A correlated variable "U" is defined and utilized to calibrate the offset voltage Vos. When the output signal De is "1" and the q[k] is "forward", the correlated variable "U" is "+1". When the output signal Dc is "1" and the q[k] is "reverse", the correlated variable "U" is "−1". When the output signal Dc is "0", the correlated variable "U" is "0". By cooperating with the choppers CHP1 and CHP2, the calibration processor 220 accumulates the correlated variable "U", wherein the accumulation of the correlated variable "U" reflects the value of the offset voltage Vos and the polarity of the offset voltage Vos can be estimated. By this way, the calibration processor 220 determines to increase or decrease the offset voltage Vos with a small fixed amount for calibrating the offset voltage Vos.

The aforementioned calibration technique is a background digital calibration, and requires less analog overhead. However, an input signal with invariant statistic is required, and the settling behavior is slow since the calibration technique is statistics-based. Therefore, it is an inevitable trend to develop a high-speed ADC with calibration capability to decrease power consumption.

SUMMARY OF THE INVENTION

Accordingly, the present invention is a comparison device with calibration and an analog-to-digital converter (ADC) using the same. The comparison device corrects the offset voltage of the comparators with no assumption on input signal statistics and is useful for high-speed ADC, especially flash ADC. The ADC using the comparison device can be implemented with minimum size for exploring low power consumption and treats the analog accuracy problem with the disclosed adaptive background calibration in digital domain. In addition, the ADC has short settling time making the ADC robust against process, voltage, and temperature (PVT) variation.

A comparison device with calibration is provided in the present invention. The comparison device includes a first through second comparators, a chop switching unit, a delta-sigma modulation unit, and a first through second compensation units. The first comparator compares a signal of the first input terminal thereof with a signal of the second input terminal thereof and generates a first comparison result. The chop switching unit respectively transmits a first and a second signals to the first and the second input terminals of the first comparator during a first period, and respectively transmits the first and the second signals to the second and the first input terminals of the first comparator during a second period. The first compensation unit compensates a third signal outputted from the chop switching unit to the first terminal of the first comparator according to the first digital control code (DCC_1) and the step-size. The second comparator compares a compensated signal with the second signal and generates a second comparison result. The second compensation unit compensates the first signal according to the second digital control code (DCC_2) and the step-size, and thereby generates the compensated signal. The delta-sigma modulation unit calculates a differential code between the first comparison result and the second comparison result with the awareness of the operation states of the chopping switch unit and generates the DCC_1 and the DCC_2 to compensate the offset voltages of the first and the second comparators.

An analog-to-digital converter (ADC) with calibration is provided in the present invention. The ADC includes at least one the said conversion device.

The present invention provides the comparison device with calibration and the ADC using the same that observe the resolved comparison results from two comparators with the same inputs and utilize the included delta-sigma modulation unit to get information from error code patterns, i.e. the different comparison results. Then, the threshold voltages of the comparators are adjusted according to the output of sigma-delta unit, i.e. the digital control codes, for eventually cancelling the offset voltages of the comparators. The ADC using the comparison device can decouple the tradeoff between power consumption and conversion accuracy of high-speed converters. In order to make the features and advantages of the present invention comprehensible preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
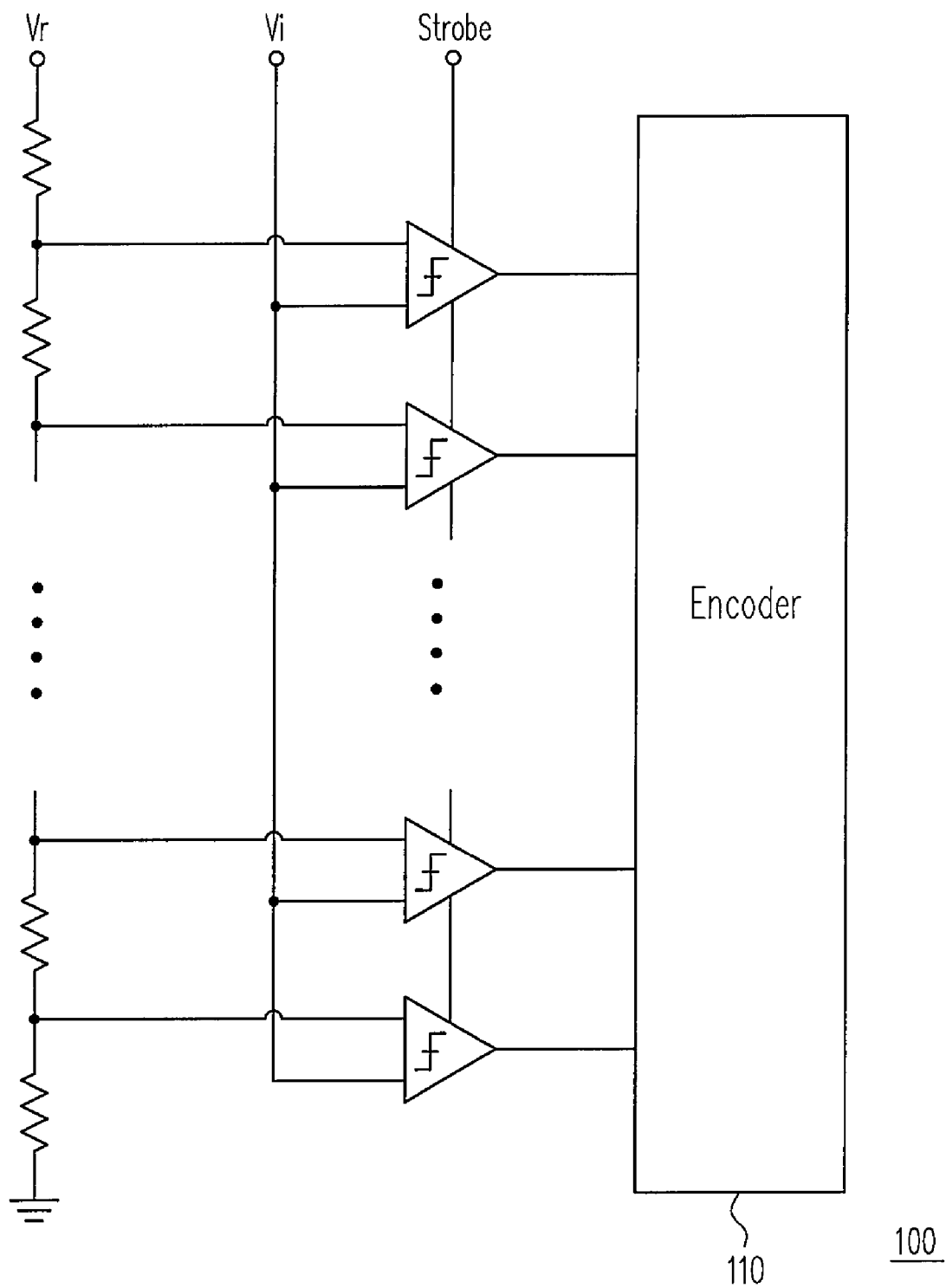
FIG. 1 is a circuit diagram of the flash ADC.
Figure 2:
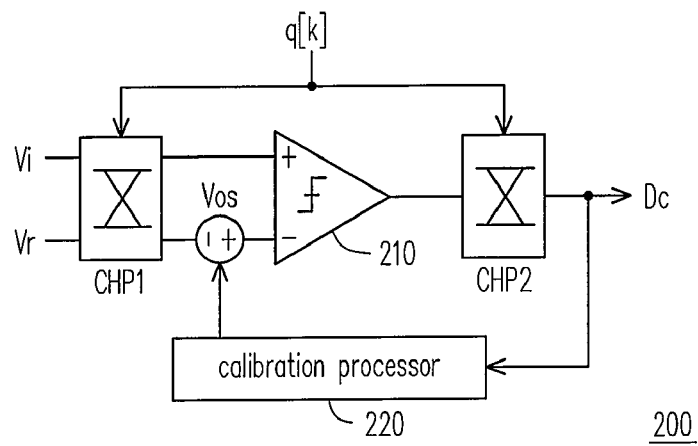
FIG. 2 is a circuit diagram of a conventional background calibration scheme for comparators.
Figure 3A:
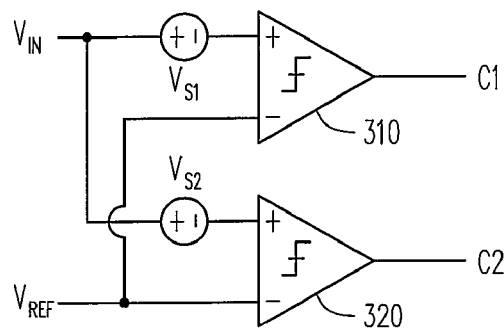
FIG. 3A is a circuit diagram of two comparators with the same input signal and the reference signal.
Figure 3B:
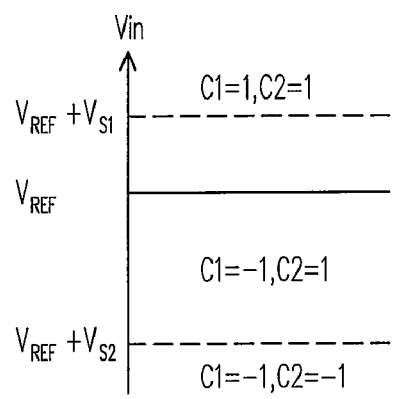
FIG. 3B is a diagram of the output signals of the comparators with offset voltage versus the input signal in FIG. 3A.

FIG. 3A is a circuit diagram of two comparators with the same input signal $V_{IN}$ and the reference voltage $V_{REF}$. FIG. 3B is a diagram of the output signals of the comparators with offset voltages versus the input signal in FIG. 3A. Referring to FIG. 3A and FIG. 3B, the comparators 310 and 320 have different offset voltages $V_{S1}$ and $V_{S2}$ respectively, that is, the threshold voltage $V_{T1}$ of the comparator 310 equals ($V_{REF}+V_{S1}$), and the threshold voltage $V_{T2}$ of the comparator 320 equals ($V_{REF}+V_{S2}$). It is assumed that the threshold voltage $V_{T1}$ is greater than the threshold voltage $V_{T2}$. If the input signal $V_{IN}$ is greater than ($V_{REF}+V_{S1}$), the output signal C1 of the comparator 310 has logic high level ("1"), so does the output signal C2 of the comparator 320. If the input signal $V_{IN}$ is less than the ($V_{REF}+V_{S2}$), the output signal C1 of the comparator 310 has logic low level ("-1"), so does the output signal C2 of the comparator 320. While the input signal $V_{IN}$ falls between the two threshold voltages $V_{T1}$ and $V_{T2}$, the output signal C1 of the comparator 310 has logic low level ("-1") and the output signal C2 of the comparator 320 has logic high level ("1"). Since the offset voltage may influence the output result of the comparator, the embodiment of the present invention provides a hardware structure to cancel the offset voltage of the comparator.

Figure 4:
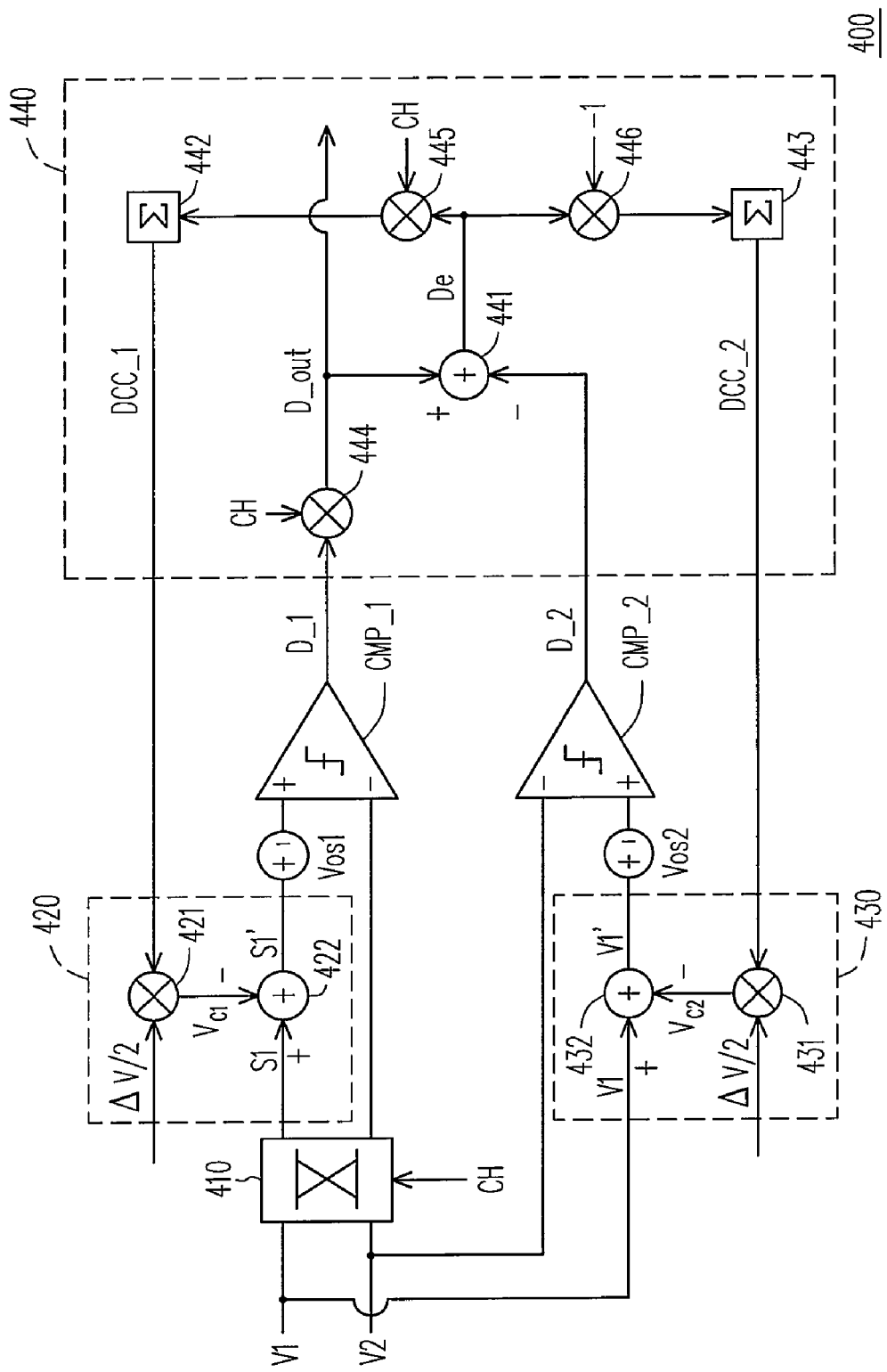
FIG. 4 is a circuit diagram of the comparison device according to an embodiment of the present invention.

FIG. 4 is a circuit diagram of the comparison device according to an embodiment of the present invention. Referring to FIG. 4, the comparison device 400 includes the comparators CMP_1 and CMP_2, the chop switching unit 410, the compensation units 420 and 430, and a delta-sigma modulation unit 440. The comparators CMP_1 and CMP_2 have different, fixed but unknown offset voltages Vos1 and Vos2 respectively. The comparator CMP_1 has a first input terminal (i.e. non-inverting terminal), a second input terminal (i.e. inverting terminal), and an output terminal, so does the comparator CMP_2. The chop switching unit 410 is controlled to switches the operations of a first period and a second period of the comparison device 400 in accordance with a control signal CH. It is assumed that the comparison device 400 performs the operation of the first period when the control signal CH has logic high level ("1"), and the comparison device 400 performs the operation of the second period when the control signal CH has logic low level ("-1").

During a first period (CH="1"), the chop switching unit 410 respectively transmits a first signal V1 and a second signal V2 to a first input terminal and a second input terminal of the comparator CMP_1. During a second period (CH="-1"), the chop switching unit 410 inverses the first signal V1 and the second signal V2, that is, the chop switching unit 410 respectively transmits the first signal Vi and the second signal V2 to the second input terminal and the first input terminal of the comparator CMP_1. At present, a comparison result D_1 of the comparator CMP_1 is inversed since the chop switching unit 410 inverses the first signal V1 and the second signal V2. In the embodiment, the first signal V1 and the second signal V2 serve as an input signal and a reference signal respectively. The comparison device 400 further includes a control unit (not illustrated in FIG. 4) to provide the control signal CH.

The compensation unit 420 is coupled between the chop switching unit 410 and the first input terminal of the comparator CMP_1. The compensation unit 420 includes a multiplier 421 and a calculator 422. The compensation unit 420 compensates a signal S1 outputted from the chop switching unit 410 to the first input terminal of the comparator CMP_1 by a compensation value $Vc_1$ which is a digital control code DCC_1 multiplied by a step-size $\Delta V/2$ and the compensation unit 420 generates an adjusted signal S1' to the first input terminal of the comparator CMP_1 for adjusting the threshold voltage Vth_1 of the comparator CMP_1. Then the comparator CMP_1 compares a signal of the first input terminal thereof with a signal of the second input terminal thereof and generates the comparison result D_1. The signal S1 can be either the first signal V1 or the second signal V2 depending on the control signal CH.

Similarly, the compensation unit 430 is coupled between the delta-sigma modulation unit 440 and the first input terminal of the comparator CMP_2. The compensation unit 430 includes a multiplier 431 and a calculator 432. The compensation unit 430 compensates the first signal V1 by a compensation value $Vc_2$ which is a digital control code DCC_2 multiplied by the step-size $\Delta V/2$ and the compensation unit 430 generates a compensated signal V1' to the first terminal of the comparator CMP_2 for adjusting a threshold voltage Vth_2 of the comparator CMP_2. The comparator CMP_2 compares the compensated signal V1' with the second signal V2 and generates a comparison result D_2.

In another embodiment, the compensation units 420 and 430 can be implemented by two separate digital-to-analog converters (DACs), with the least-significant-bit(LSB) of $\Delta V/2$. And the digital control codes DCC_1 and DCC_2 serve as the digital inputs of the two DACs.

The delta-sigma modulation unit 440 calculates a differential code De between the comparison results D_1 and D_2 with the awareness of the operation states of the chop switch unit 440, e.g. the control signal CH, and generates the digital control codes DCC_1 and DCC_2 for the comparators CMP_1 and CMP_2. Referring to FIG. 4, the delta-sigma modulation unit 440 includes a calculator 441, the accumulators 442 and 443 and the multipliers 444 through 446. The multiplier 444 is coupled to the output terminal of the comparator CMP_1 and multiplies the comparison result D_1 by the control signal CH. Since the control signal CH has two logic levels, i.e. "1" or "−1", the multiplier 444 outputs the comparison result D_1 or an inversed comparison result D_1' according to the control signal CH. The calculator 441 calculates the differential code De between an output D_out of the multiplier 444, which is related to the comparison result D_1, and the comparator result D_2 of the comparator CMP_2.

The multiplier 445 is coupled to the calculator 441 for multiplying the differential code De by the control signal CH. Since the control signal CH has two logic levels, i.e. "1" or "−1", the multiplier 445 outputs the differential code De or an inversed differential De' according to the control signal CH. The accumulator 442 accumulates the product of the differential code De and the control signal CH, i.e. an output of the multiplier 445, and then outputs the digital control code DCC_1 for the compensation unit 420. The multiplier 446 multiplies the differential code De by −1. The accumulator 443 accumulates the product of the differential code De and −1, i.e. an output of the multiplier 446, and then outputs the digital control code DCC_2 for the compensation unit 430.

In the embodiment, the first signal V1 serving as the input signal can be a swing voltage so that the comparison results D_1 and D_2 change with the first signal V1, and the comparison results D_1 and D_2 may have the same logic level or different logic levels. During the first period (CH="1"), if the comparison results D_1 and D_2 have the same logic level, e.g. D_1=D_2="1" or D_1=D_2="−1", the differential code De between the comparison results D_1 and D_2 is zero and the accumulators 442 and 443 keep (or record) the previous digital control codes DCC_1 and DCC_2 respectively. If the comparison results D_1 and D_2 have different logic levels, e.g. D_1="1", D_2="−1" or D_1="−1", D_2="1", the accumulator 442 accumulates the differential code De between the comparison results D_1 and D_2, i.e. "2" or "−2", and generates the digital control code DCC_1. The accumulator 443 is opposite to the accumulator 442 since the multiplier 446 multiplies the differential code De by −1. In other word, the accumulator 443 directly accumulates the inversed differential code De' between the comparison results D_1 and D_2 and generates the digital control code DCC_2. In the delta-sigma modulation unit 440, the calculator 441 can be implemented by a 1-bit adder and the multipliers 444 through 446 can be implemented by 1-bit multipliers, therefore they can be implemented by very simple logic gates.

During the first period, the chop switching unit 410 respectively transmits the first signal V1 and the second signal V2 to the first input terminal and the second input terminal of the comparator 410. Referring to FIG. 4, if D_1="1" and D_2="−1" occurs, it means the threshold voltage Vth_1 of the comparator CMP_1 is less than the voltage Vth_2 of the comparator CMP_2. Meanwhile, the accumulator 442 in the delta-sigma modulation unit 440 accumulates the differential code De "2" and the digital control code DCC_1 is increased by 2. The compensation unit 420 decreases the signal S1 (i.e. herein is the first signal V1) by an additional two LSBs, i.e. ΔV. In another aspect, the compensation unit 430 increases the first signal V1 by an additional two LSBs, i.e. ΔV, via the accumulator 443. As for the comparator CMP_1, decreasing the first signal V1 by the compensation value $V_{C1}$ can be seen equivalent to increase the threshold voltage Vth_1 of the comparator CMP_1 by the compensation value $Vc_1$ during the first period. To reason by analogy, as for the comparator CMP_2, increasing the first signal V1 by the compensation value $Vc_2$ is equivalent to decrease the threshold voltage Vth_2 by the compensation value $Vc_2$ during the first period. After adaptively adjust the two comparators' threshold voltages, the two comparators generate the same codes (i.e. comparison results) for any first signal V1, in other words, they achieve steady state.

In another embodiment of the present invention, the multiplier 446 in the delta-sigma modulation unit 440 can be omitted, and the input terminal polarity of the calculator 432, which is coupled to the multiplier 431, is changed from "−" to "+".

The accumulators 442 and 443 in the delta-sigma modulation unit 440 activate as long as there are different codes (i.e. comparison results) resolved from two comparators CMP_1 and CMP_2. Mathematically, the threshold voltages Vth_1 and Vth_2 of the comparators CMP_1 and CMP_2 can be respectively represented by the following equations:

$$\text{Vth}\_1 = V2 + Vos1 + V_{C1} = V2 + Vos1 + (\Delta V/2) \times \sum_{i=1}^{n} (\text{D}\_1_i - \text{D}\_2_i), \text{ and}$$

$$\text{Vth}\_2 = V2 + Vos2 - V_{C2} = V2 + Vos2 + (\Delta V/2) \times \sum_{i=1}^{n} (\text{D}\_1_i - \text{D}\_2_i)$$

Figure 5A:
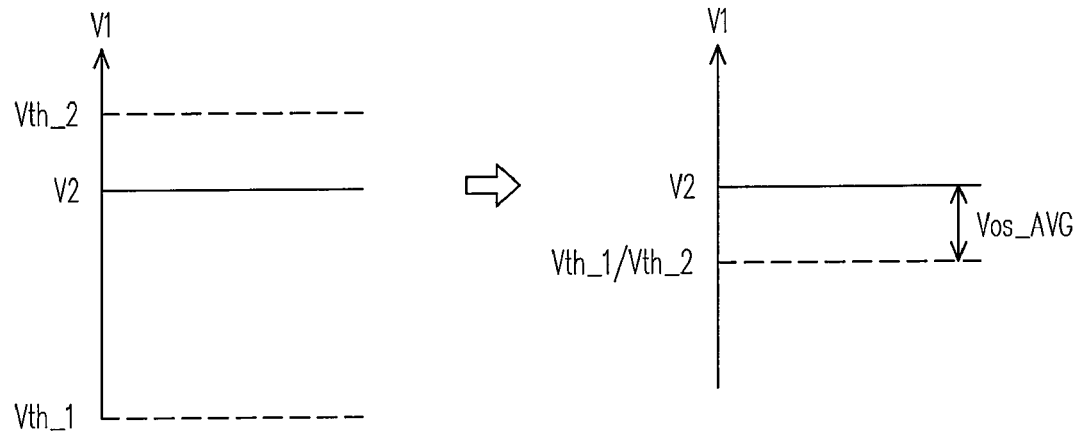
FIG. 5A is a variation diagram of the threshold voltages of the comparators during the first period according to the embodiment of the present invention.
Figure 5B:
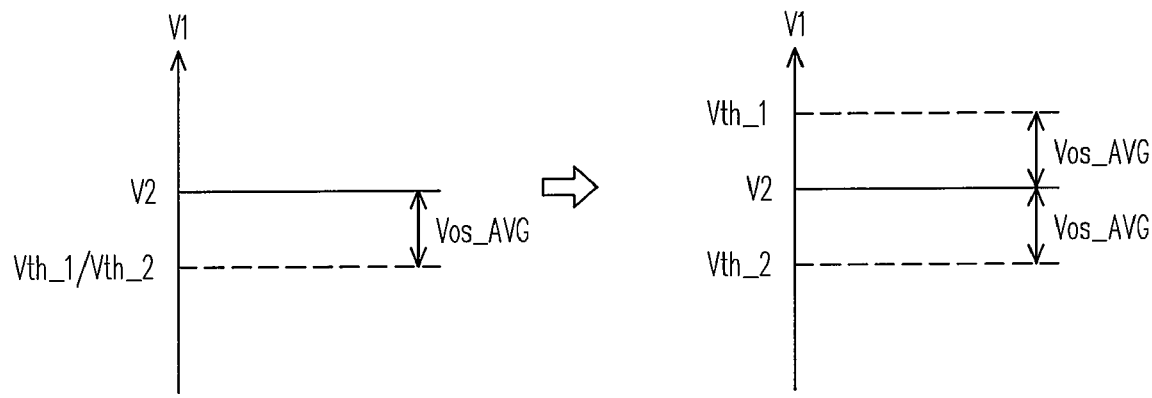
FIG. 5B is a variation diagram of the threshold voltages of the comparators during the second period according to the embodiment of the present invention.

It is assumed that the step-size ΔV is small enough, after achieving the steady state, the threshold voltage Vth_1 of the comparator CMP_1 equals the threshold voltage Vth_2 of the comparator CMP_2 while the comparison results D_1 and D_2 always have the same logic level. FIG. 5A is a variation diagram of the threshold voltages of the comparators during the first period according to the embodiment of the present invention. Referring to FIG. 5A, by continuous operation of the comparison device 400 during the first period, the threshold voltages Vth_1 and Vth_2 of the comparators CMP_1 and CMP_2 are averaged and equal when the accumulators 442 and 443 in the delta-sigma modulation unit 440 has settled. At present, the said equations can be rewritten as:

$Vth\_1=Vth\_2=V2+(Vos1+Vos2)/2=V2+Vos\_AVG$,
wherein $V_{C1}=V_{C2}=(Vos2-Vos1)/2$ During the second period (CH="−1"), the chop switching unit 410 respectively transmits the first signal V1 and the second signal V2 to the second input terminal and the first input terminal of the comparator CMP_1. Meanwhile the comparison result D_1 of the comparator CMP_1 is inversed. In the aforementioned operation description of the first period, the digital control codes DCC_1 and DCC_2 are recorded in the delta-sigma modulation unit 440. FIG. 5B is a variation diagram of the threshold voltages of the comparators during the second period according to the embodiment of the present invention. Referring to FIG. 5B, equivalently the threshold offset Vos_AVG of the comparator CMP_1 is inversed and the threshold voltage Vth_1 of the comparator CMP_1 is mirrored to V2−(Vos1+Vos2)/2 when the first signal V1 and the second signal V2 are reversed by the chop switching unit 410 during the second period. The circuit operation during the second period is the same as that during the first period. That is to say, the threshold voltages Vth_1 and Vth_2 of the comparators CMP_1 and CMP_2 are averaged again during the second period, and then the offset voltages Vos1 and Vos2 are cancelled after achieving the steady state.

Figure 6A:
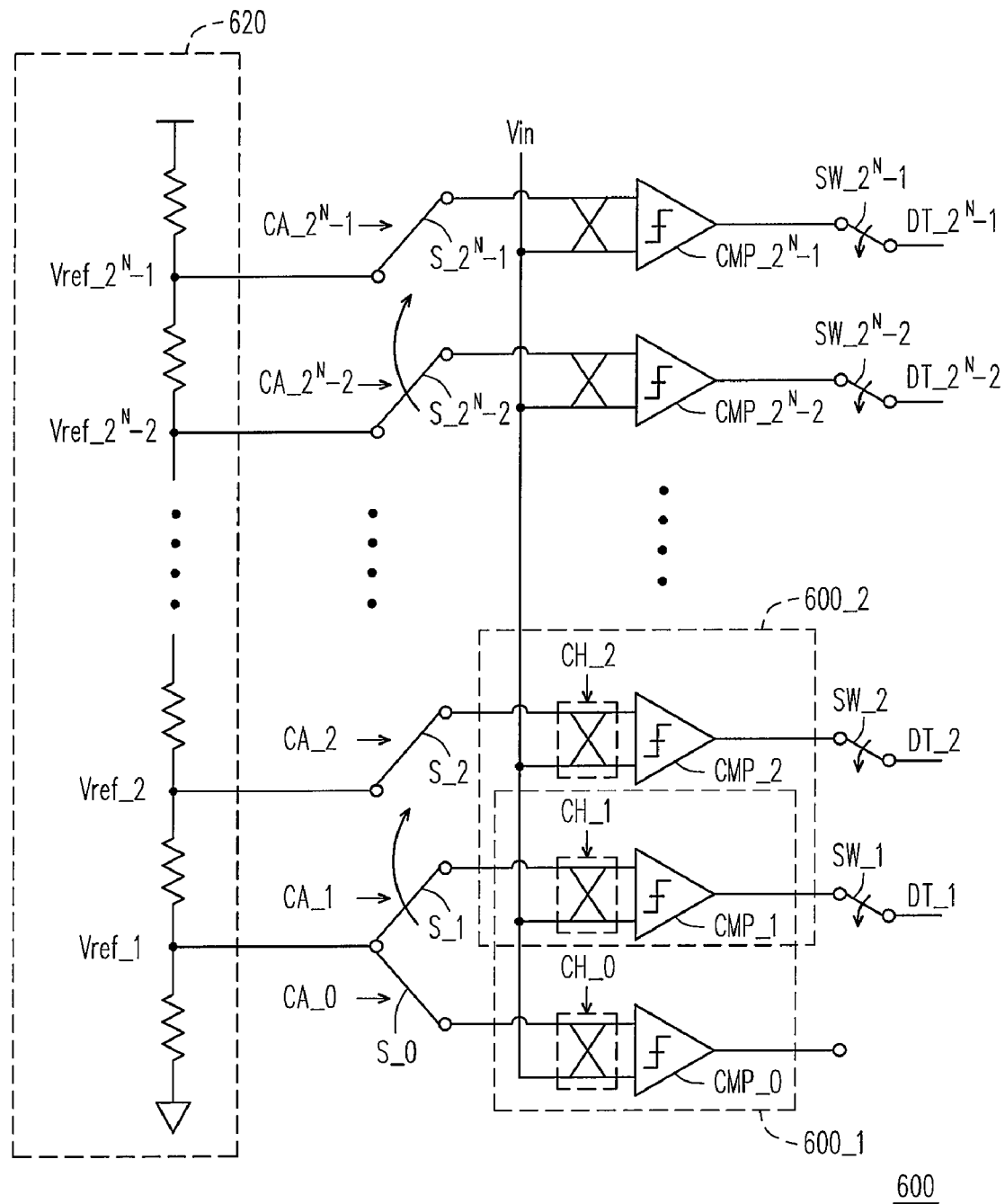
FIG. 6A is a circuit diagram of the ADC according to an embodiment of the present invention.

In order to make people ordinarily skilled in the art to implement the embodiment of the comparison device 400 easily, there is another embodiment described below in respect of the comparison device adapting to the analog-todigital converter (ADC). FIG. 6A is a circuit diagram of the ADC according to an embodiment of the present invention. Referring to FIG. 6A, the N-bit ADC 600 includes $2^N$ comparators CMP_0 through CMP_$2^N$-1, a series resistor 620 and a plurality of switches S_0 through S_$2^N$-1, wherein only one auxiliary comparator CMP_0 is utilized to calibrate each of comparators CMP_1 through CMP_$2^N$-1. Every two adjacent comparators can compose the said comparison device 400, wherein some circuit units of each comparison device are not shown in FIG. 6, such as the control unit, the delta-sigma modulation unit, and the compensation units, etc. The resistor 620 provides $2^N$-1 reference voltages Vref_1 through Vref_$2^N$-1 according to the reference ladder. The comparators CMP_0 and CMP_$2^N$-1 are only connected to the reference voltages Vref_1 and Vref_$2^N$-1 respectively via the switches S_0 and S_$2^N$-1, and the comparator CMP_1 can be connected to either Vref_i or Vref_i+1 via the switch S_i depending on the switch signal CA_i, wherein $1 \leq i \leq 2^N-2$. The switches S_0 and S_$2^N$-1 can be replaced by conductive wires in another embodiment of the present invention.

Figure 6B:
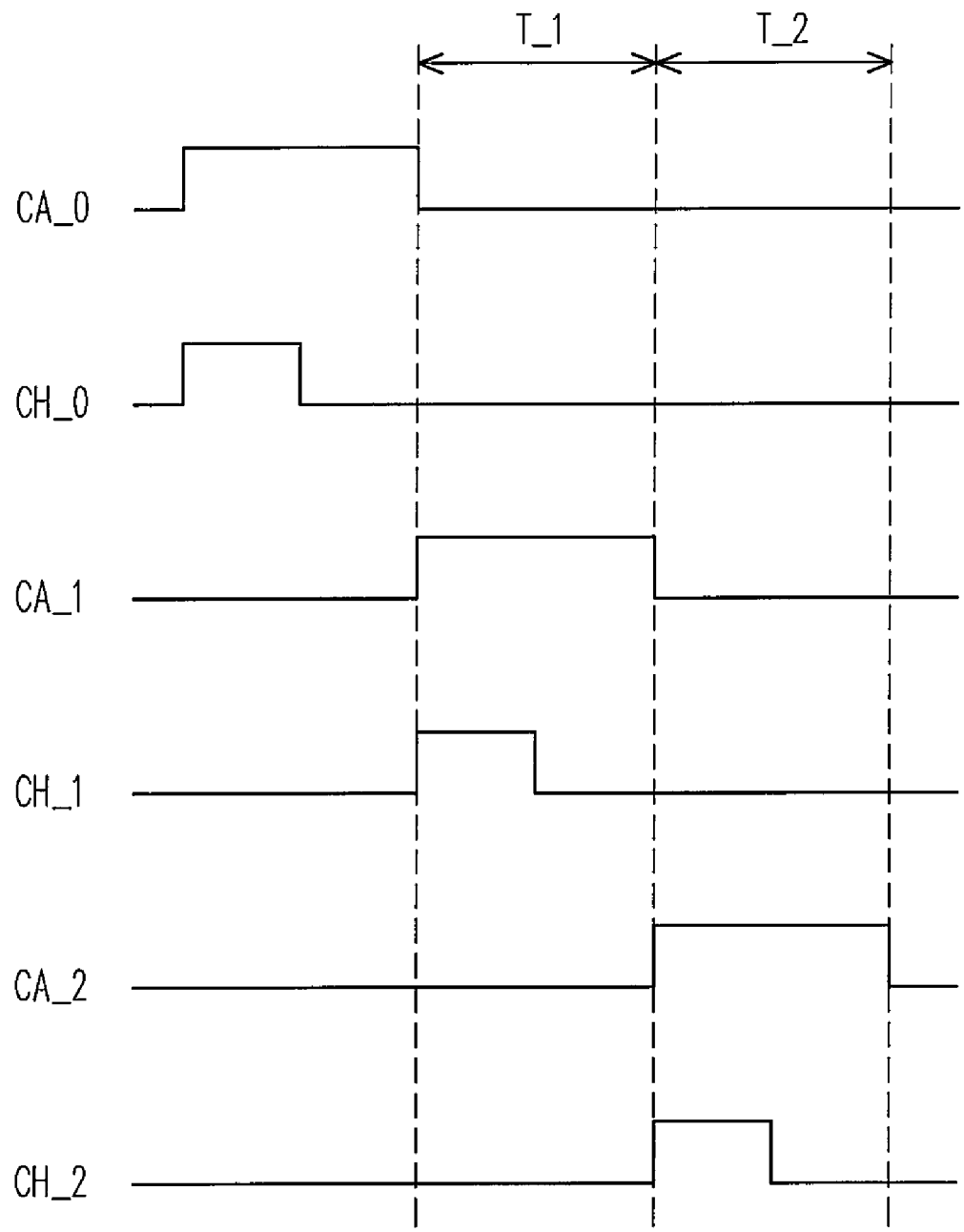
FIG. 6B is a timing control diagram of the ADC according to the embodiment of the present invention in FIG. 6A.

FIG. 6B is a timing control diagram of the ADC according to the embodiment of the present invention in FIG. 6A. Referring to FIG. 6A and FIG. 6B, in the first calibration phase T_1, the comparator CMP_1 is coupled to the reference Vref_1 via the switch S_1 while the switch signal CA_1 is asserted, and the comparator CMP_0 is also coupled to the reference Vref_1 via the switch S_0. At present, the comparators CMP_0 and CMP_1 compose the comparison device 600_1. When the control signal CH_1 is asserted, the operation of the comparison device 600_1 is the same with the first period operation of the said comparison device 400 in FIG. 4 for adjusting the threshold voltages of the comparators CMP_0 and CMP_1. When the control signal CH_1 is not asserted, the threshold voltage of one of comparators CMP_0 and CMP_1 (herein is the comparator CMP_1) is mirrored and then the operation of the comparison device 600_1 is the same with the first period operation of the said comparison device 400 in FIG. 4 for cancelling the offset voltages of the comparators CMP_0 and CMP_1. In the embodiment, either the comparison result of the comparator CMP_0 or the comparison result of the comparator CMP_1 can be selected as an output DT_1, and other comparators CMP_2 through CMP_$2^N$-1 respectively generate the comparison results as the outputs DT_2 through DT_$2^N$-1. The auxiliary switches SW_1 through SW_$2^N$-1 are configured after the comparators CMP_1 through CMP_$2^N$-1 for selecting the comparison results of correct comparators to output.

In the second calibration phase T_2, the comparator CMP_1 is coupled to the reference Vref_2 via the switch S_1 while the switch signal CA_1 is not asserted, and the comparator CMP_2 is also coupled to the reference Vref_2 via the switch S_2 while the switch signal CA_2 is asserted. At present, the comparators CMP_1 and CMP_2 compose of the comparison device 600_2. The comparison device 600_2 is switched to the operation of the first period or the second period in accordance with the control signal CH_2. To reason by analogy, any calibration phase, there are only two comparators connected to the same reference voltage, and the comparison result of one comparator in the comparison device can be ignored. Therefore, thermal codes (i.e. the outputs DT_1 through DT_$2^N$-1) are generated for each of the reference voltage Vref_1 through Vref_$2^N$-1.

Referring to FIG. 6A, it is noted that after the comparators CMP_$2^N$-1 and CMP_$2^N$-2 finish the offset cancellation, the comparators CMP_$2^N$-2 and CMP_$2^N$-3 continue the calibration instead of the comparators CMP_0 and CMP_1 for minimizing the switching activities on the reference ladder. By well designing the timing control, i.e. maintaining long enough time of each calibration phase, the offset voltages of two comparators can be averaged and then cancelled because of getting enough effective samples during each calibration phase. Although the said embodiment is assumed the calibration is performed from bottom comparator CMP_0 to top comparator CMP_$2^N$-1, the invention is not limited in the embodiment, that is, there is no limitation in calibration order. Only one additional comparator is utilized in the embodiment to calibrate all the comparators included in the ADC.

In summary, the said embodiments describe the comparison device with calibration that utilizes the resolved comparison results from two comparators to perform the calibration. During the first period, the comparison device accumulates the differential code between the comparison results of the comparators with the awareness of the operation states of the chop switching unit, e.g. the control signal CH, for obtaining the two digital control codes. In steady state, the two comparators will have the same threshold voltage, equivalently, the threshold offsets are averaged. During the second period, the chopping operation enable the comparison device inverse the threshold offset of one comparator and then averages the two threshold voltages of the comparators for cancelling the offset voltages of the comparators, since at the beginning of the second period, the two comparators have the offsets with the same magnitude by opposite directions.

The described digital calibration technique is hardware efficient and is performed without any assumption on input signal statistics. By applying the comparison device to the analog-to-digital converter (ADC), only one additional comparator is needed for N-bit ADC. A background digital calibration scheme can be performed with fast settling speed and therefore the ADC is robust to fast Process, Voltage and Temperature (PVT) variations. The disclosed comparison device is useful in flash ADC as well as other ADC architectures with a comparator array inside.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A comparison device with calibration, comprising:
    a first comparator, having a first input terminal, a second input terminal, and an output terminal generating a first comparison result;
    a chop switching unit, transmitting a first signal and a second signal to the first input terminal and the second input terminal of the first comparator respectively during a first period, and transmitting the first signal and the second signal to the second input terminal and the first input terminal of the first comparator respectively during a second period, wherein the chop switching unit switches the operation states of the first period and the second period according to a control signal;
    a first compensation unit, coupled between the chop switching unit and the first input terminal of the first comparator for compensating a third signal outputted from the chop switching unit to the first terminal of the first comparator according to a first digital control code and a step-size; and
    a delta-sigma modulation unit, calculating a differential code between the first comparison result and a second comparison result with the awareness of the operation states of the chop switch unit, and generating the first digital control code and the second digital control code;

a second comparator, having a first input terminal receiving a compensated signal, a second input terminal receiving the second signal, and an output terminal generating the second comparison result; and a second compensation unit, coupled between the delta-sigma modulation unit and the first input terminal of the second comparator for compensating the first signal according to the second digital control code and the step-size, and generating the compensated signal.

2. The comparison device with calibration as claimed in claim 1, wherein the delta-sigma modulation unit comprises:

a first multiplier, coupled to the output terminal of the first comparator for outputting the first comparison result or an inversed first comparison result according to the control signal;

a first calculator, calculating the differential code between an output of the first multiplier and the second comparison result;

a second multiplier, outputting the differential code or an inversed differential code according to the control signal;

a first accumulator, accumulating an output of the second multiplier, and outputting the first digital control code; and a second accumulator, accumulating the differential code, and outputting the second digital control code.

3. The comparison device with calibration as claimed in claim 1, wherein the first compensation unit comprises:

a third multiplier, multiplying the first digital code by the step-size, and outputting a first compensation value; and a second calculator, subtracting the third signal from the first compensation value, and generating an adjusted third signal to the first input terminal of the first comparator.

4. The comparison device with calibration as claimed in claim 1, wherein the second compensation unit comprises:

a fourth multiplier, multiplying the second digital code by the step-size, and outputting a second compensation value; and a third calculator, adding the first signal and the second compensation value up, and generating the compensated signal to the first input terminal of the second comparator.

5. The comparator with calibration as claimed in claim 1, further comprising:

a control unit, providing the control signal to the chop switching unit.

6. An analog-to-digital converter with calibration, comprising at least one conversion device, wherein the conversion device comprises:

a first comparator, having a first input terminal, a second input terminal, and an output terminal generating a first comparison result;

a chop switching unit, transmitting a first signal and a second signal to the first input terminal and the second input terminal of the first comparator respectively during a first period, and transmitting the first signal and the second signal to the second input terminal and the first input terminal of the first comparator respectively during a second period, wherein the chop switching unit switches the operations of the first period and the second period according to a control signal;

a first compensation unit, coupled between the chop switching unit and the first input terminal of the first comparator for compensating a third signal outputted from the chop switching unit to the first terminal of the first comparator according to a first digital control code and a step-size; and a delta-sigma modulation unit, calculating a differential code between the first comparison result and a second comparison result, and generating the first digital control code and a second digital control code;

a second comparator, having a first input terminal receiving a compensated signal, a second input terminal receiving the second signal, and an output terminal generating the second comparison result; and a second compensation unit, coupled between the delta-sigma modulation unit and the first input terminal of the second comparator for compensating the first signal according to the second digital control code and the step-size and generating the compensated signal.

7. The analog-to-digital converter with calibration as claimed in claim 6, wherein the delta-sigma modulation unit comprises:

a first multiplier, coupled the output terminal of the first comparator for outputting the first comparison result or an inversed first comparison result according to the control signal;

a first calculator, calculating the differential code between an output of the first multiplier and the second comparison result;

a second multiplier, outputting the differential code or an inversed differential code according to the control signal;

a first accumulator, accumulating an output of the second multiplier, and outputting the first digital control code; and a second accumulator, accumulating the differential code, and outputting the second digital control code.

8. The analog-to-digital converter with calibration as claimed in claim 6, wherein the first compensation unit comprises:

a third multiplier, multiplying the first digital code by the step-size, and outputting a first compensation value; and a second calculator, subtracting the third signal from the first compensation value, and generating an adjusted third signal to the first input terminal of the first comparator.

9. The analog-to-digital converter with calibration as claimed in claim 6, wherein the second compensation unit comprises:

a fourth multiplier, multiplying the second digital code by the step-size, and outputting a second compensation value; and a third calculator, adding the first signal and the second compensation value up, and generating the compensated signal to the first input terminal of the second comparator.

10. The analog-to-digital converter with calibration as claimed in claim 6, further comprising:

a control unit, providing the control signal to the chop switching unit.

* * * * *